United States Patent [19]
Katou et al.

[11] Patent Number: 5,953,620
[45] Date of Patent: Sep. 14, 1999

[54] METHOD FOR FABRICATING A BONDED SOI WAFER

[75] Inventors: Hirotaka Katou; Hiroshi Furukawa; Kazuaki Fujimoto, all of Hiratsuka, Japan

[73] Assignee: Komatsu Electronics Metals Co., Ltd., Hiratsuka, Japan

[21] Appl. No.: 08/764,588

[22] Filed: Dec. 13, 1996

[30] Foreign Application Priority Data

Dec. 15, 1995 [JP] Japan .................................. 7-347658

[51] Int. Cl.$^6$ ........................... H01L 21/302; H01L 21/34
[52] U.S. Cl. ........................... 438/406; 438/455; 438/458; 156/281
[58] Field of Search .................................. 438/406, 455, 438/458, 459, FOR 410, FOR 485; 228/116, 903; 156/281, 306.3, 629

[56] References Cited

U.S. PATENT DOCUMENTS

| | | | |
|---|---|---|---|
| 4,671,846 | 6/1987 | Shimbo et al. | 438/455 |
| 4,883,215 | 11/1989 | Goesele et al. | 438/455 |
| 4,962,879 | 10/1990 | Goesele et al. | 438/455 |
| 5,207,864 | 5/1993 | Bhat et al. | 438/455 |
| 5,232,870 | 8/1993 | Ito et al. . | |
| 5,234,535 | 8/1993 | Beyer et al. | 438/406 |
| 5,308,400 | 5/1994 | Chen | 134/2 |
| 5,451,547 | 9/1995 | Himi et al. . | |
| 5,763,288 | 12/1993 | Sakaguchi et al. . | |

FOREIGN PATENT DOCUMENTS

| | | |
|---|---|---|
| 0171186 | 5/1985 | European Pat. Off. . |
| 7263290 | 10/1995 | Japan . |

OTHER PUBLICATIONS

Karin Ljungberg, Ulf Jansson, Stefan Bengtssaon, and Anders Soderbarg, "Modification of Silicon Surfaces with H2SO4:H202:HF and HNO3:HF for Wafer Bonding Applications", J. Echem. Soc. vol. 143, No. 5, p. 1709, May 1996.

Karin Ljungberg, Ulf Jansson, Stefan Bengtssaon, and Anders Soderbarg, "Modification of Silicon Surfaces with H2SO4:H2O2:HF and HNO3:HF for Wafer Bonding Applications", Proceedings of the Third International Sympossium on Semiconductor Wafer Bonding: Phys, May 1995.

M.K. Weldon "Physics and Chemistry of Silicon Wafer Bonding Investigated by Infrared Absorption Spectoscopy" J.Vac.Sci.Technol. B 14(4) 3095–3105, 1996.

Karin Ljungberg "Modification of Silicon Sufaces w/ H2SO4:H2O2:FHAND HNO3:HF for Wafer Bonding Applications" J. Electrochem. Soc. vol. 142 1709–1714, 1996.

Karin Ljungberg "Proceedings of the Third International Symposium on Semiconductor Wafer Bonding: Physics and Applications" Electrochem. Soc. pp. 163–173 of vii+610 pp. 26 refs, May 1995.

*Primary Examiner*—Charles Bowers
*Assistant Examiner*—Martin Sulsky
*Attorney, Agent, or Firm*—Varndell Legal Group

[57] ABSTRACT

A method for fabricating a bonded SOI wafer is provided in which no void is produced during a waiting period from the completion of a bonding step to the start of a bonding thermal processing step without a special restriction. The method for fabricating a bonded SOI wafer includes a bonding step in which an active wafer, which has been single- or both-side mirror polished and thermal oxidation processed to form an insulating layer of a predetermined thickness, is pressed and bonded to a single- or both-side mirror polished base wafer; and a bonding thermal processing step for carrying out a bonding thermal processing for bonding the wafer, in which a hydrophobic processing step for the base wafer and a hydrophilic processing step for the active wafer are carried out before the bonding step.

8 Claims, 2 Drawing Sheets

METHOD FOR FABRICATING A BONDED SOI WAFER

BACKGROUND OF THE INVENTION

1. Field of the Invention

The present invention relates to a method for fabricating a bonded SOI wafer, and more specifically, to a bonding process for the bonded SOI wafer.

2. Description of Related Art

In a conventional method for fabricating a bonded SOI wafer, as shown in FIG. 3, a single- or both-side mirror polished base wafer 1 and an active wafer 2, which has been single- or both-side mirror polished and thermal oxidization processed to form an insulating film ($SiO_2$) 2a of a predetermined thickness are subjected to hydrophilic processing by cleaning them with the use of a solution of ammonia and hydrogen peroxide and then the wafers are pressed and bonded with the use of a bonding jig. And after passage of a predetermined period, the bonded wafers are subjected to a bonding thermal processing After bonding, the waiting period until the bonding thermal processing is suitably determined taking the due time and the availability of the furnace into account.

As stated above, the waiting period from the completion of bonding to the start of bonding thermal processing varies for each lot, and for some lots, as shown in FIG. 4, voids 3 are produced on the boundaries of the wafer. This figure shows a result of examination of the bonded SOI wafer by supersonic probes, which has been left for 36 hours after the bonding. The voids, which distribute in the region having a distance of 1.5 mm –5 mm to the wafer edge, tend to multiply as the waiting period from the completion of the bonding step to the start of the bonding thermal processing step is increased. The number of voids does not increase after the bonding thermal processing. If the bonded wafer has even only one void, this wafer must be discarded as a rejected article. Accordingly, the thermal processing must be adjusted so that the waiting period is shortened.

Conventionally, direct bonded wafers are used in which two silicon wafers are used as substitution for epitaxial wafers, for example. With respect to this bonded wafer, Japanese Patent Application Laid Open No. 7-263290 discloses a method for fabricating such a bonded wafer, in which two silicon wafers are bonded after cleaning them with hydrofluoric acid. In this method, since the oxide films on the surfaces of the wafers are removed, there has been a problem that an SOI wafer having an insulation film as an intermediate layer cannot be fabricated.

SUMMARY OF THE INVENTION

The present invention is made taking note of the above-mentioned conventional problem and aims to provide a method for fabricating a bonded SOI wafer in which no void occurs even though no special limitation is set to the waiting period from the completion of the bonding step to the start of the bonding thermal processing step.

To achieve the above object, the method for fabricating a bonded SOI wafer according to the present invention includes a bonding step in which an active wafer, which has been single- or both-side mirror polished and thermal oxidation processed to form an insulating layer of a predetermined thickness, is pressed and bonded to a single- or both-side mirror polished base wafer; and a bonding thermal processing step for bonding the wafer, wherein the method is characterized in that a hydrophobic processing step for the base wafer and a hydrophilic processing step for the active wafer are carried out before the bonding step.

The hydrophobic processing step is preferably a wet process using hydrofluoric acid solution. The hydrofluoric acid solution means a solution which is mainly composed of hydrofluoric acid having a hydrofluoric acid concentration to such an extent that enough to remove a native oxide film, and which may contain other components.

Moreover, a dry etching step may be carried out as the hydrophobic processing step for the base wafer.

Further, as the dry etching step, a plasma etching step may be carried out.

As the hydrophilic processing step, other than a cleaning step using a solution of ammonia and hydrogen peroxide, a cleaning (SPM) step using a solution of sulfuric acid and hydrogen peroxide or a cleaning step using a solution of hydrochloric acid and hydrogen peroxide may be carried out.

The present invention modifies the pre-processes which are carried out prior to the bonding step. That is, the present invention is characterized in that the hydrophilic processing step is carried out for the active wafer and the hydrophobic processing step is carried out for the base wafer. Whereby, voids are not produced in the periphery of the wafers regardless of the length of the waiting period from the completion of bonding step to the start of bonding thermal processing step.

Since the active wafer is hydrophilic processed, a clean wafer surface can be obtained while keeping most of the oxide film intact. Moreover, since the hydrophobic processing for the base wafer is to clean the native oxide film on the base wafer by the etching processing using the hydrofluoric acid solution (HF) having a concentration high enough to sufficiently remove the native oxide film, the surface of the base wafer is made a clean surface suitable for bonding. By bonding the active wafer surface over which the hydrophilic processing has been carried out to remove the impurities and add OH radicals, and the cleaned base wafer surface over which the hydrophobic processing has been carried out to remove the native oxide film together, the wafers are tightly bonded. Even if the waiting period from the completion of the bonding step to the start of the bonding thermal processing becomes long, no void is produced, thus highly reliable bonded wafers can be obtained.

Meantime, the method may be such that after carrying out the hydrophilic processing over the both the base wafer and the active wafer, the hydrophobic processing is carried out only over the base wafer.

As described above, according to the present invention, since the hydrofluoric acid hydrophobic processing step for the base wafer and the hydrophilic processing step for the active wafer are carried out, no void will be generated in the wafer periphery so far the waiting period is shorter than 240 hours, hence it is possible to remarkably reduce the rejection rate due to the void. Moreover, the waiting period from the bonding step to the bonding thermal processing can be prolonged considerably, thus it becomes easy to manage the fabricating processes.

DETAILED DESCRIPTION OF THE INVENTION

Figure 1:
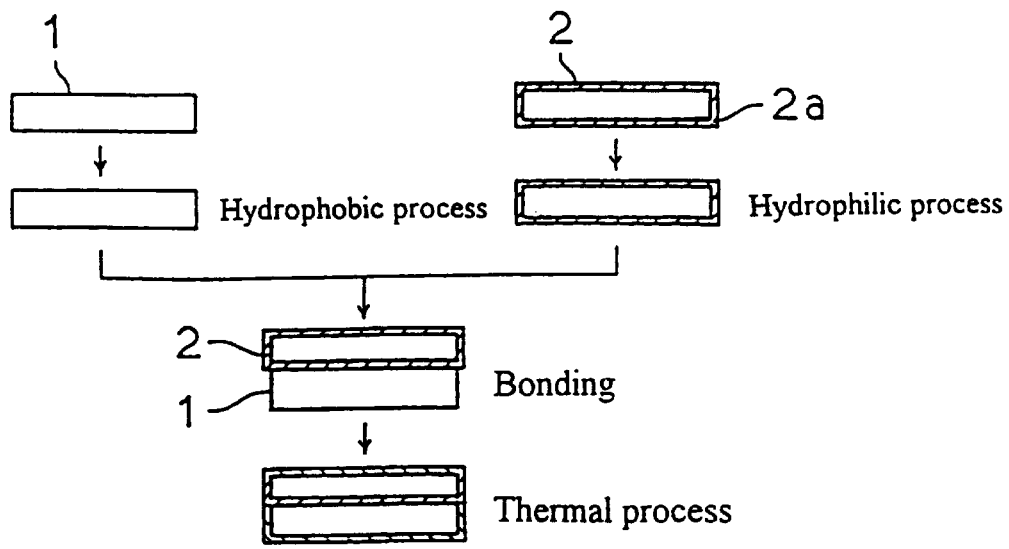
FIG. 1 illustrates the steps for fabricating a bonded SOI wafer.

The embodiment of the method for fabricating a boded SOI wafer according to the present invention will be described in accompaniment with the drawings. FIG. 1 illustrates the steps for fabricating a bonded SOI wafer.

A hydrophobic processing step for a base wafer 1, which is a single- or both-side mirror polished silicon wafer, is carried out. The hydrophobic processing step means a cleaning of the base wafer 1 by a hydrofluoric acid solution whose concentration is high enough to remove the native oxide film on the wafer surface. On the other hand, an active oxide 2 is a wafer which has been single- or both-side mirror polished and thermal oxidation processed to form an insulating film ($SiO_2$) 2a of a predetermined thickness over the wafer surface, for which a hydrophilic processing step is carried out. The hydrophilic processing step may be either one of a cleaning step using a solution of ammonia and hydrogen peroxide, a cleaning (SPM) step using a solution of sulfuric acid and hydrogen peroxide and a cleaning step using a solution of hydrochloric acid and hydrogen peroxide.

The thus processed base wafer 1 and active wafer 2 are pressed to bond together with the use of a bonding jig, and then subjected to a bonding thermal processing.

Experimental results of the bonded SOI wafer fabricated by the aforementioned method are described as follows.

Each of the hydrofluoric acid solutions having HF concentrations of 1.5%, 5%, 10% and 49% was utilized to clean a base wafer. Active wafers were cleaned by the solution of ammonia and hydrogen peroxide to provide a hydrophilic property. The two wafers were then bonded with the use of the bonding jig and bonding state was confirmed. Further, the state of void formation was examined for each waiting period until the start of the bonding thermal processing. For comparison, a base wafer and an active wafer which have been hydrophilic processed by the conventional method were bonded and the same examinations as mentioned above were conducted.

Figure 2:
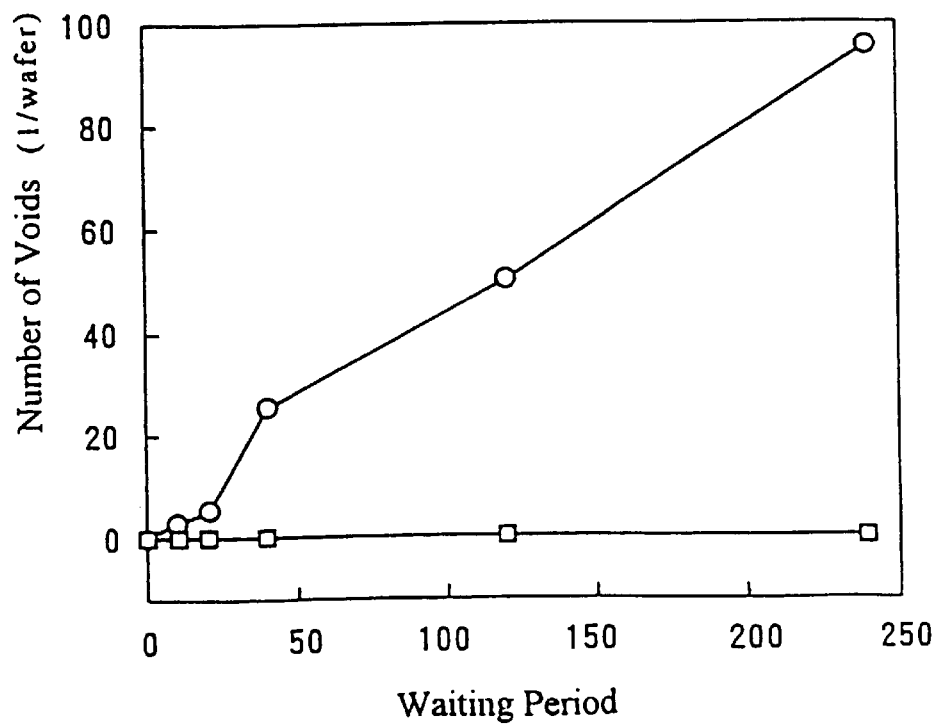
FIG. 2 illustrates the relationship between the waiting period after bonding and the number of generated voids.
Figure 3:
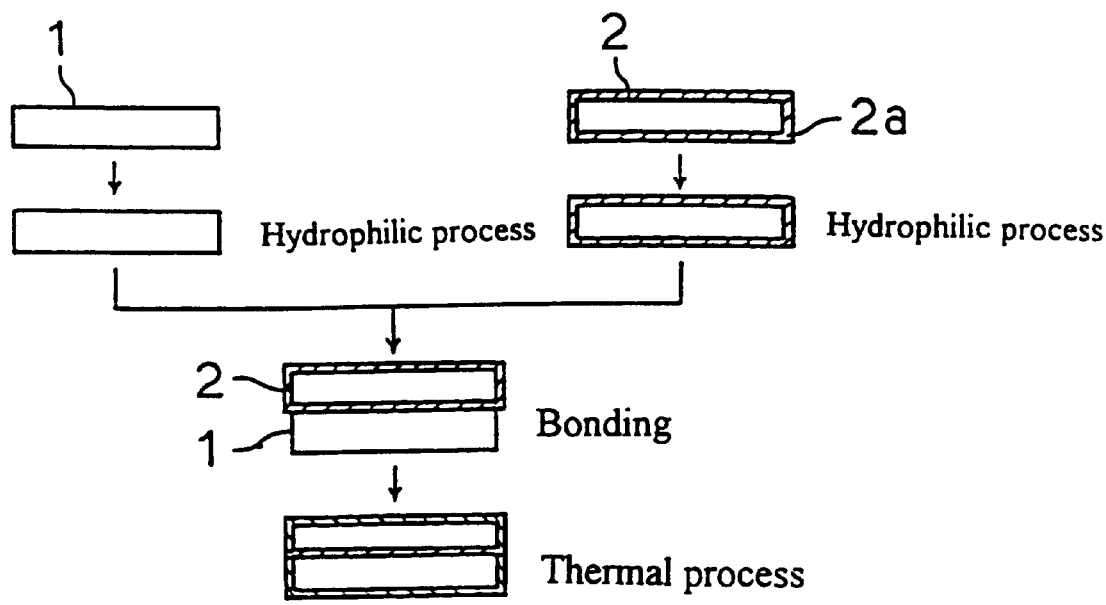
FIG. 3 illustrates the steps in a conventional method for fabricating a bonded SOI wafer.
Figure 4:
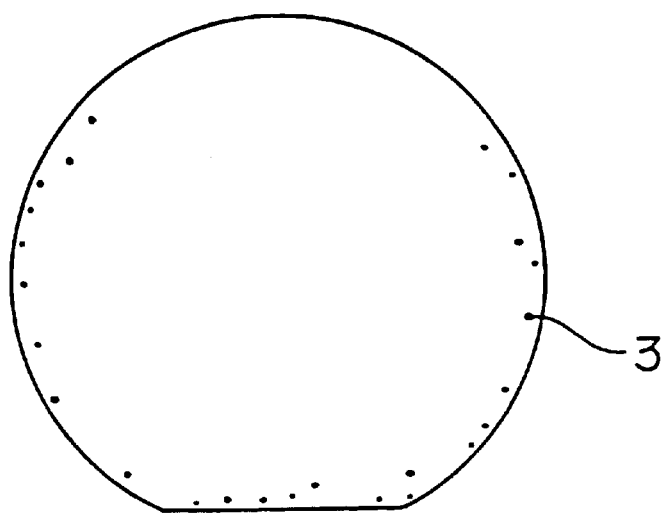
FIG. 4 illustrates an example of generation of voids in a bonded SOI wafer fabricated by the conventional method.

FIG. 2 illustrates the relationship between the waiting period after bonding and the number of voids per wafer. In the bonded wafer fabricated by the conventional method in which the base wafer and the active wafer have been hydrophilic processed, voids were generated after one hour from the bonding and about 100 voids were observed after 240 hours. On the contrary, no void was observed in the bonded wafers including the base wafers which were cleaned by hydrofluoric acid solutions having HF concentrations of 1.5%, 5%, 10% and 49%, and the active wafers which were cleaned by the solution of ammonia and hydrogen peroxide to provide the hydrophilic property. Therefore, it was confirmed that if the base wafer is cleaned by the solution capable of removing the native oxide film on the base wafer, such as having an HF concentration of more than 1.5%, no void will be produced even though the waiting period exceeds 240 hours after bonding. Regarding the bonding strength, the base wafer surfaces were cleaned by the four solutions of different HF concentrations and thermal processed by a temperature identical with a case where the hydrophilic processing by the conventional method is employed; however, there was found no difference between the strength of these ones and that of those hydrophilic processed by the conventional method.

In the aforementioned embodiment, the hydrophobic processing step is carried out by means of hydrofluoric acid solution; however, the method is not limited only to this. Any methods, including another wet process or a dry etching such as a plasma etching process, may be employed so far those methods can remove the native oxide film formed on the base wafer surface.

What is claimed is:

1. A method for fabricating a bonded SOI wafer where a base wafer and an active wafer are thermally bonded together, the active wafer prepared by mirror polishing a single or both sides thereof and then forming an insulating layer of a first thickness over the active wafer by thermal oxidizing thereof, the base wafer prepared by mirror polishing a single or both sides thereof, the method comprising the steps of:

subjecting the base wafer to hydrophobic processing, subjecting the active wafer to hydrophilic processing, pressing and bonding the base and active wafers together with the insulating layer of the active wafer arranged between the active and base wafers, and subjecting the bonded wafers to thermal processing to thermally bond the wafers together.

2. The method as claimed in claim 1, wherein the hydrophobic processing step for the base wafer is a wet process using a solution of hydrofluoric acid.

3. The method as claimed in claim 1, wherein the hydrophobic processing step for the base wafer is a dry etching process.

4. The method as claimed in claim 3, wherein the dry etching process is a plasma etching process.

5. The method as claimed in claim 1, wherein the hydrophilic processing step for the active wafer is a cleaning step using a solution of ammonia and hydrogen peroxide.

6. The method as claimed in claim 1, wherein the hydrophilic processing step for the active wafer is a cleaning step using a solution (SPM) of sulfuric acid and hydrogen peroxide.

7. The method as claimed in claim 1, wherein the hydrophilic processing step for the active wafer is a cleaning step using a solution of hydrochloric acid and hydrogen peroxide.

8. A method for fabricating a bonded SOI wafer where a base wafer and an active wafer are thermally bonded together, the active wafer prepared by mirror polishing a single or both sides thereof and then forming an insulating layer of a first thickness over the active wafer by thermal oxidizing thereof, the base wafer prepared by mirror polishing a single or both sides thereof, the method comprising the steps of:

subjecting the base wafer and the active wafer to hydrophilic processing, further subjecting the base wafer to hydrophobic processing, pressing and bonding the base and active wafers together with the insulating layer of the active wafer arranged between the active and base wafers, and subjecting the bonded wafers to thermal processing to thermally bond the wafers together.

\* \* \* \* \*